(12) United States Patent
Nakanishi et al.

(10) Patent No.: US 10,889,187 B2
(45) Date of Patent: Jan. 12, 2021

(54) ON-VEHICLE POWER SUPPLY SYSTEM AND A STATE DETECTING METHOD FOR BATTERY CONTAINED IN ON-VEHICLE POWER SUPPLY SYSTEM

(71) Applicant: GS Yuasa International Ltd., Kyoto (JP)

(72) Inventors: Yuki Nakanishi, Shizuoka (JP); Kazuhiro Sugie, Shizuoka (JP); Takeshi Chiba, Shizuoka (JP)

(73) Assignee: GS Yuasa International Ltd., Kyoto (JP)

( * ) Notice: Subject to any disclaimer, the term of this patent is extended or adjusted under 35 U.S.C. 154(b) by 368 days.

(21) Appl. No.: 16/066,240

(22) PCT Filed: Jan. 11, 2017

(86) PCT No.: PCT/JP2017/000682
§ 371 (c)(1),
(2) Date: Jun. 26, 2018

(87) PCT Pub. No.: WO2017/122698
PCT Pub. Date: Jul. 20, 2017

(65) Prior Publication Data
US 2020/0269699 A1 Aug. 27, 2020

(30) Foreign Application Priority Data
Jan. 13, 2016 (JP) .................................. 2016-004260

(51) Int. Cl.
*B60L 58/18* (2019.01)
*B60L 58/12* (2019.01)
(Continued)

(52) U.S. Cl.
CPC .............. *B60L 3/0092* (2013.01); *B60K 6/28* (2013.01); *B60L 58/12* (2019.02); *B60L 58/18* (2019.02);
(Continued)

(58) Field of Classification Search
CPC . B60K 6/28; B60L 58/12; B60L 58/18; B60L 3/0092; B60L 2200/92; B60L 2210/10; B60R 16/033
(Continued)

(56) References Cited

U.S. PATENT DOCUMENTS

2002/0186019 A1    12/2002  Arai
2011/0014501 A1*    1/2011  Scheucher .............. B60L 53/11
                                                        429/7
(Continued)

FOREIGN PATENT DOCUMENTS

CN    103076571 A  *  5/2013  ........... G01R 31/367
JP    2003-115331 A      4/2003
(Continued)

OTHER PUBLICATIONS

Japan Patent Office, International Search Report (ISR) and Written Opinion for International Application No. PCT/JP2017/000682, dated Mar. 21, 2017, 8 pages, Japan.

*Primary Examiner* — Atul Trivedi
(74) *Attorney, Agent, or Firm* — Alston & Bird LLP (57) ABSTRACT

A vehicle-mounted power supply system according to the present invention is provided with: a main battery; a sub-battery; a voltage regulating unit which regulates the voltage of power supplied from the main battery and the sub-battery; and a state detecting unit which detects the state of the sub-battery. The state detecting unit is provided with: a first calculating unit which calculates a first internal resistance on the basis of a drop in the voltage across the sub-battery and (Continued)

an inrush current when the sub-battery supplies power to a load; a second calculating unit which manipulates the voltage regulating unit immediately following the calculation of the first internal resistance, and subsequently at least one more time, to cause the sub-battery to be forcibly discharged, and calculates a second internal resistance on the basis of a relationship between the voltage across the sub-battery and the current flowing thereinto when forcibly discharged; and a state determining unit which determines the state of the sub-battery on the basis of the first internal resistance and changes in the second internal resistance.

10 Claims, 7 Drawing Sheets

(51) Int. Cl.
  *B60K 6/28* (2007.10)
  *B60R 16/033* (2006.01)
  *B60L 3/00* (2019.01)
(52) U.S. Cl.
  CPC ......... *B60R 16/033* (2013.01); *B60L 2210/10* (2013.01); *B60Y 2200/92* (2013.01)
(58) Field of Classification Search
  USPC ...................................................... 701/29.2
  See application file for complete search history.

(56) References Cited

U.S. PATENT DOCUMENTS

| | | | |
|---|---|---|---|
| 2012/0268074 A1* | 10/2012 | Cooley | H01G 2/065 320/130 |
| 2013/0013238 A1* | 1/2013 | Kawakita | B60L 58/12 702/63 |
| 2014/0107956 A1* | 4/2014 | Miyaki | B60L 58/12 702/63 |
| 2014/0170511 A1* | 6/2014 | Tolmachev | H01M 8/188 429/418 |
| 2014/0222358 A1 | 8/2014 | Morita et al. | |
| 2014/0365792 A1* | 12/2014 | Yun | H02J 7/00036 713/320 |
| 2015/0115872 A1* | 4/2015 | Letombe | H02M 3/3388 320/107 |
| 2015/0127281 A1 | 5/2015 | Kusano et al. | |
| 2015/0214757 A1* | 7/2015 | Zane | H02J 7/0021 320/107 |
| 2015/0251556 A1* | 9/2015 | Meyer | B60L 3/0046 701/22 |
| 2015/0331472 A1* | 11/2015 | Iwamoto | H02J 7/342 713/323 |
| 2016/0363634 A1* | 12/2016 | Cheng | G01R 31/392 |
| 2017/0141589 A1* | 5/2017 | Inoue | H02J 5/00 |
| 2019/0018070 A1* | 1/2019 | Yamada | G01R 31/396 |
| 2019/0296304 A1* | 9/2019 | Sodeyama | H01M 2/1055 |
| 2020/0122584 A1* | 4/2020 | Zhang | B60L 1/00 |
| 2020/0185922 A1* | 6/2020 | Hinterberger | H02J 7/34 |
| 2020/0274203 A1* | 8/2020 | Kirleis | H01M 10/482 |
| 2020/0274368 A1* | 8/2020 | Crouse, Jr. | H02J 3/385 |
| 2020/0274386 A1* | 8/2020 | Kirleis | H02J 7/005 |
| 2020/0298722 A1* | 9/2020 | Smolenaers | H02P 27/08 |

FOREIGN PATENT DOCUMENTS

| | | | | |
|---|---|---|---|---|
| JP | 2005-263068 A | 9/2005 | | |
| JP | 2013-072838 A | 4/2013 | | |
| JP | 2014-149280 A | 8/2014 | | |
| JP | 2015-090342 A | 5/2015 | | |
| WO | WO-2013065454 A1 * | 5/2013 | ................ | H02J 1/00 |
| WO | WO-2013136413 A1 * | 9/2013 | ............ | H02J 7/0022 |
| WO | WO-2016002485 A1 * | 1/2016 | .............. | B60L 58/20 |

* cited by examiner

Fig. 6

ON-VEHICLE POWER SUPPLY SYSTEM AND A STATE DETECTING METHOD FOR BATTERY CONTAINED IN ON-VEHICLE POWER SUPPLY SYSTEM

CROSS REFERENCE TO RELATED APPLICATIONS

This application is a national stage application, filed under 35 U.S.C. § 371, of International Application No. PCT/JP2017/000682, filed Jan. 11, 2017, which application claims priority to Japanese Application No. 2016-004260, filed Jan. 13, 2016, the contents of both of which as are hereby incorporated by reference in their entirety.

BACKGROUND

Technical Field

The present invention relates to the detection of a state of a sub battery contained in an on-vehicle power supply system which includes: a main battery; the sub battery connected in parallel with the main battery; a voltage adjuster for controlling voltages of powers supplied from the main battery and the sub battery respectively.

Description of Related Art

Recently, along with the expansion of a market of an ADAS (Advanced Driver Assistance Systems), to realize the improvement of fuel consumption and ensuring of a safety function of a vehicle, the use of an on-vehicle power supply system which includes a plurality of 14V-system power sources or two power sources consisting of a 42V-system power source and a 14V-system power source has been spreading. This on-vehicle power supply system includes a main battery and a sub battery.

The main battery is used for supplying electricity necessary for driving accessories at the time of performing motor assisting or idling stop during traveling of a vehicle. Energy generated during deceleration is stored in the main battery as regenerated energy. As the main battery, for example, a lithium ion secondary battery, a nickel-metal hydride rechargeable battery or an electric double layer capacitor is used.

The sub battery is used as a backup (supply of a dark current) of accessories at the time of starting an engine of a vehicle or at the time of parking the vehicle, or as an emergency power source at the time of occurrence of a failure in the main battery. As the sub battery, a lead-acid battery which has high-capacity but is inexpensive is used. During normal traveling of a vehicle, the main battery is mainly used and the sub battery is rarely used.

As described above, the sub battery is used as an emergency-use power source at the time of occurrence of a failure in the main battery and hence, it is necessary to always maintain the sub battery in a usable state. Accordingly, it is inevitable to detect a state of the sub battery such as whether or not the sub battery is degraded or a failure (short-circuiting, breaking of a wire or the like) occurred also during traveling of the vehicle.

As a method for detecting a state of an engine starter lead-acid battery mounted on a vehicle, various methods have been proposed. For example, there has been known a method where, by paying an attention to the correlation between the degradation or a failure of a battery and an internal resistance, the internal resistance is calculated based on lowering of a voltage of a battery at the time of starting an engine of a vehicle, and a state of the battery is detected using the calculated internal resistance.

Further, as a method for detecting a state of a lead acid battery at the time of traveling of a vehicle, in JP-A-2005-263068, there has been proposed a method where an output voltage of an alternator is controlled at the time of traveling of the vehicle. In this case, the internal resistance of the battery is calculated based on a change in a voltage and a current, and a state of the battery is detected using the change in the voltage and the current.

BRIEF SUMMARY

An internal resistance of a battery can be considered as a sum of a parts resistance and a reaction resistance. However, with the technique disclosed in JP-A-2005-263068, during traveling of a vehicle, only a portion of an internal resistance (reaction resistance) of a lead-acid battery can be detected, and a parts resistance of the lead-acid battery cannot be detected. Accordingly, it is difficult for the technique to accurately detect a state of the battery.

The present invention has been made in view of the above-mentioned circumstances, and it is an object of the present invention to provide an on-vehicle power supply system and a state detecting method for a battery which can accurately detect a state of a sub battery even during traveling of a vehicle, and can prevent in advance a state where the sub battery is not operated so that a failure occurs in a power source.

An on-vehicle power supply system according to an aspect of the present invention includes: a main battery, a sub battery connected in parallel with the main battery, a voltage adjuster which controls a voltage of power supplied from the main battery and the sub battery, and a state detector which detects a state of the sub battery, wherein the state detector comprises a first calculating unit which obtains a first internal resistance that contains a reaction resistance and a parts resistance of the sub battery, a second calculating unit which obtains a second internal resistance that contains a reaction resistance of the sub battery, and a state determining unit which determines a state of the sub battery, wherein the first calculating unit calculates the first internal resistance based on a voltage drop amount and an inrush current of the sub battery when supplying power to a load, wherein the second calculating unit calculates the second internal resistance based on a relation between a voltage and a current of the sub battery when forcedly discharging the sub battery by controlling the voltage adjuster immediately after calculating the first internal resistance and thereafter once or more, and wherein the state determining unit determines the state of the sub battery based on the first internal resistance and a transition of the second internal resistance.

A state detecting method, according to another aspect of the present invention, for a sub battery in an on-vehicle power supply system that includes a main battery, the sub battery connected in parallel with the main battery, a voltage adjuster which controls a voltage of power supplied from the main battery and the sub battery, includes: a first step to calculate a first internal resistance, which contains a reaction resistance and a parts resistance, based on a voltage drop amount and an inrush current of the sub battery when supplying power to a load, a second step to calculate a second internal resistance, which contains a reaction resistance of the sub battery, based on a relation between a voltage and a current of the sub battery when forcedly discharging the sub battery by controlling the voltage adjuster immediately after calculating the first internal resistance and thereafter once or more, and a third step to determine a state of the sub battery based on the first internal resistance and a transition of the second internal resistance.

According to the present invention, it is possible to provide the on-vehicle power supply system and the state detecting method for a battery which can accurately detect a state of the sub battery even during traveling of a vehicle, and can prevent in advance a state where the sub battery is not operated so that a failure occurs in a power source.

Although novel features of the present invention will be described in attached Claims, the present invention will be understood more deeply by the following detailed description which relates the configuration and the content of the present invention and is made with reference to drawings along with other objects and technical features of the present invention.

DETAILED DESCRIPTION OF VARIOUS EMBODIMENTS

The present invention relates to the detection of a state of a sub battery in an on-vehicle power supply system which includes: a main battery; a sub battery connected in parallel with the main battery; and a voltage adjuster which controls a voltage of power supplied from the main battery and the sub battery. The main battery is used for assisting a motor and for supplying power to accessories and the like during traveling of a vehicle. On the other hand, the sub battery is used for starting of an engine of a vehicle or as an emergency power source when a failure occurs in the main battery. During normal traveling (also including idling stop) of the vehicle, the main battery is mainly used, and the sub battery is rarely used. Accordingly, during normal traveling of the vehicle, a state of the sub battery (internal resistance which is the combination of parts resistance and reaction resistance) cannot be accurately grasped.

In view of the above, in the present invention, a state of the sub battery is accurately detected using a first internal resistance of the sub battery obtained based on a voltage drop amount and an inrush current of the sub battery at the time of supplying power to a load (for example, a starter motor) of the sub battery, and a second internal resistance of the sub battery obtained based on a change in a voltage and a current caused when the sub battery is forcibly discharged subsequently. Forced discharge of the sub battery and the obtainment of the second internal resistance are usually performed at a point of time that the sub battery is rarely used such as at the time of normal traveling (including idling stop) of a vehicle. With such an operation, a state of the sub battery can be accurately detected even at the time of normal traveling of a vehicle. As a result, it is possible to prevent in advance the occurrence of a failure due to the degradation of the sub battery during normal traveling of a vehicle. The calculation of the second internal resistance is performed immediately after calculation of the first internal resistance and one or more times thereafter. The calculation of the second internal resistance performed immediately after calculation of the first internal resistance may be performed periodically or when necessary. The obtainment of the second internal resistance performed immediately after calculation of the first internal resistance may be started as soon as possible after the initialization of a system which controls a hydraulic system and an electric system of the vehicle is finished. That is, the obtainment of the second internal resistance may be performed within several minutes after the calculation of the first internal resistance is finished. The first internal resistance corresponds to a sum of a reaction resistance and a parts resistance. The second internal resistance corresponds to a reaction resistance. So long as the on-vehicle power supply system can be established, a battery may be additionally provided.

Figure 1:
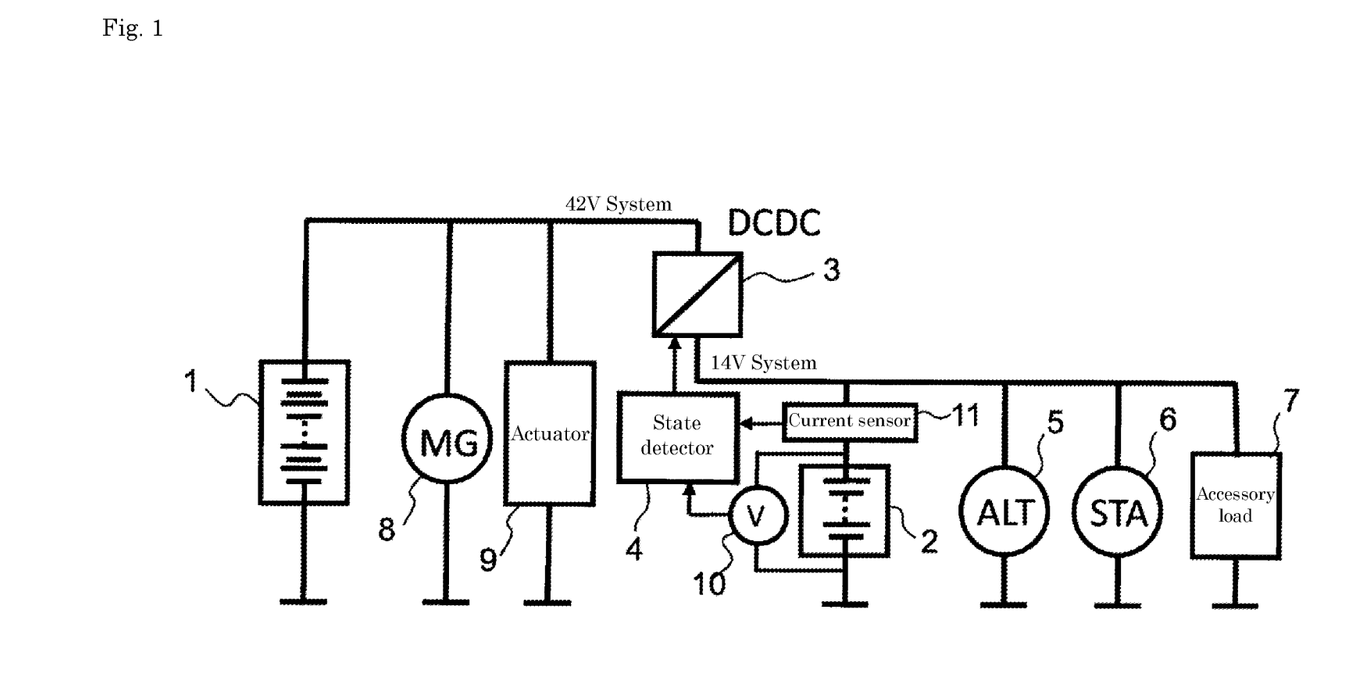
FIG. 1 is a constitutional view of an on-vehicle power supply system according to one embodiment of the present invention.

Hereinafter, an on-vehicle power supply system according to one embodiment of the present invention is described. However, the present invention is not limited to such an on-vehicle power supply system. FIG. 1 is a constitutional view of an on-vehicle power supply system including two power sources (42V-system power source and 14V-system power source).

As shown in FIG. 1, the on-vehicle power supply system includes: a main battery 1; a sub battery 2 connected in parallel with the main battery 1; a voltage adjuster (DC/DC converter, for example) 3 which controls a voltage of power supplied from the main battery 1 and a voltage of power supplied from the sub battery 2; and a state detector 4 for detecting a state of the sub battery 2. The voltage adjuster 3 is connected to the main battery 1, and the sub battery 2 is connected in parallel to the voltage adjuster 3. The voltage adjuster 3 outputs a power source voltage from the main battery 1 after stepping down the power source voltage, and is connected to the sub battery 2 on an output side of the voltage adjuster 3. On the output side of the voltage adjuster 3, an alternator (ALT) 5, a starter motor (STA) 6, and an accessory load 7 are connected to the sub battery 2. A motor generator (MG) 8 for generating a driving force for a vehicle and an actuator 9 for adjusting a hydraulic brake are respectively connected to the main battery 1 on an input side of the voltage adjuster 3 before a voltage of the main battery 1 is stepped down.

A 36V-system nickel-metal hydride rechargeable battery is used as the main battery 1, for example. The main battery 1 is used for supplying electricity necessary for assisting the vehicle during traveling of the vehicle or for driving accessories at the time of idling stop. Energy generated during deceleration is stored in the main battery 1 as regenerated energy.

A 12V-system lead-acid battery is used as the sub battery 2, for example. The sub battery 2 is used as a battery for starting an engine of a vehicle, an emergency power source at the time of occurrence of a failure in the main battery 1, or a backup (supply of a dark current) to accessories (accessory load 7) at the time of parking.

As the accessory load 7, for example, lamps, wipers, an air conditioner, and audio equipment may be named.

The vehicle power supply system also includes: a voltage sensor 10 for detecting a voltage between terminals of the sub battery 2; and a current sensor 11 for detecting a current flowing in the sub battery 2.

Figure 2:
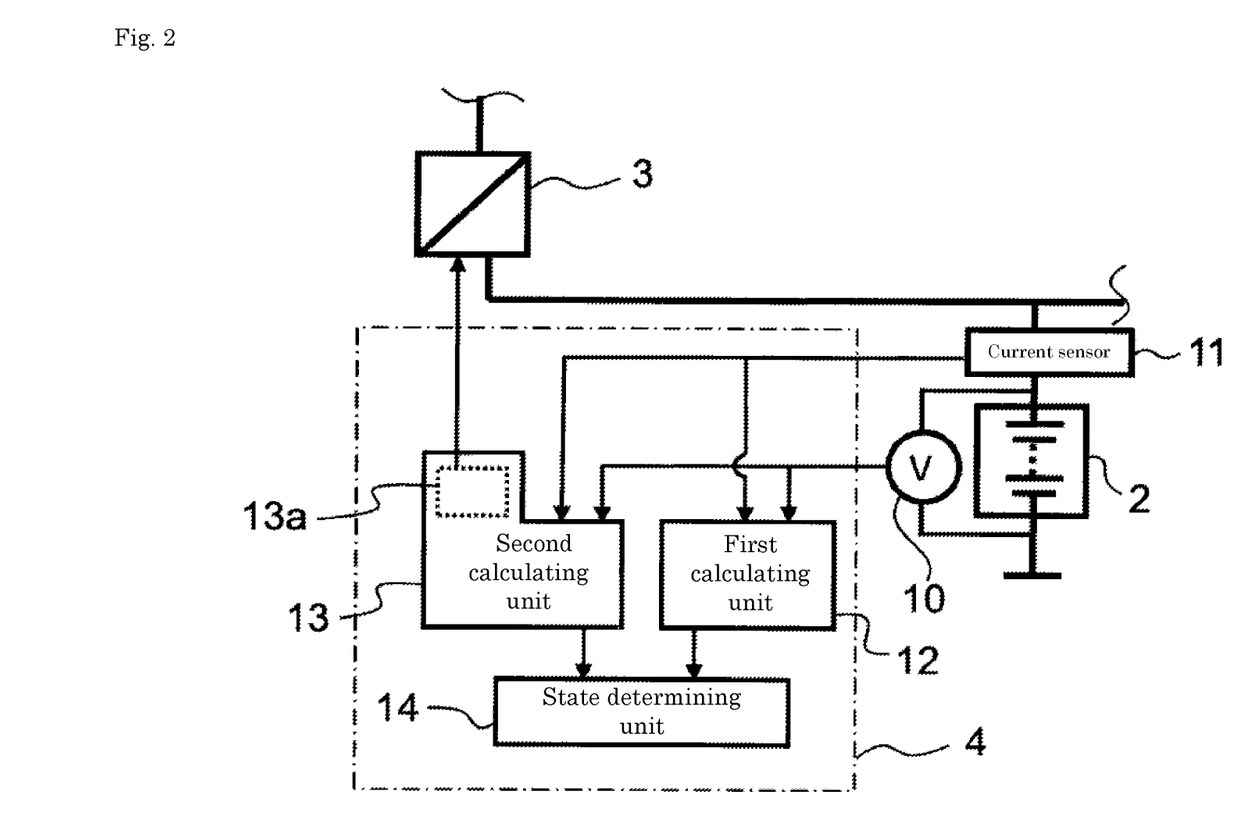
FIG. 2 is a constitutional view showing a main part of the on-vehicle power supply system shown in FIG. 1.

As shown in FIG. 2, the state detector 4 includes: a first calculating unit 12 for acquiring a first internal resistance (a sum of a reaction resistance and a parts resistance) of the sub battery 2; a second calculating unit 13 for acquiring a second internal resistance (a reaction resistance) of the sub battery 2; and a state determining unit 14 for determining a state of the sub battery 2. The second calculating unit 13 includes a voltage controller 13*a* for operating the voltage adjuster 3.

The first calculating unit 12 calculates the first internal resistance based on a voltage drop amount and an inrush current of the sub battery 2 when supplying power to a load (STA 6, for example) of the sub battery 2. The second calculating unit 13, at the time of normal traveling of the vehicle, forcibly discharges the sub battery 2 by controlling a voltage applied to the sub battery 2 by operating the voltage adjuster 3 immediately after calculating the first internal resistance and thereafter once or more (periodically or when necessary), and calculates the second internal resistance based on a relation between a voltage and a current of the sub battery 2 at the time of such forced discharging of the sub battery 2. The state determining unit 14 determines a state of the sub battery 2 based on the transition of the first internal resistance and the second internal resistance.

Figure 3:
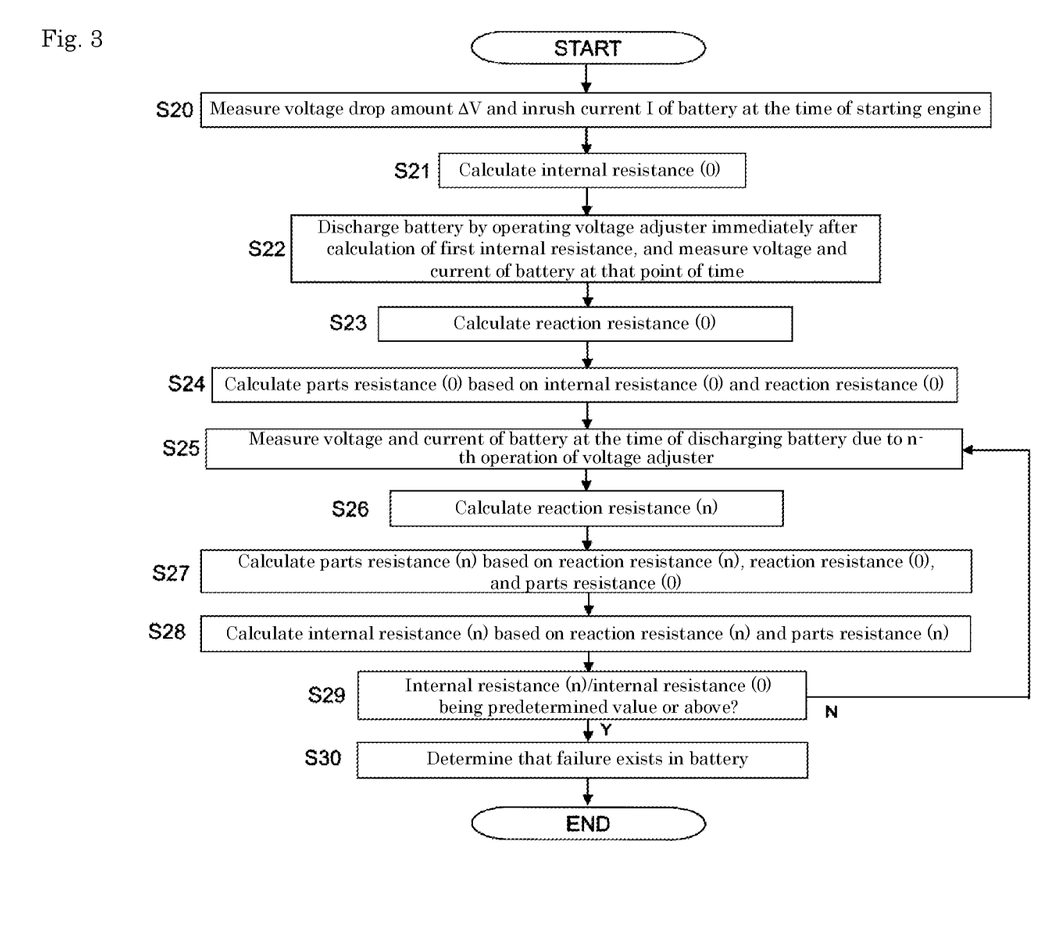
FIG. 3 is a flowchart relating to the detection of a state of a sub battery 2 by a state detector 4 in the on-vehicle power supply system shown in FIG. 1.

Hereinafter, the manner of operation of the state detector 4 in the above-mentioned on-vehicle power supply system is described. FIG. 3 is a flowchart relating to the detection of a state of the sub battery 2 by the state detector 4 in the on-vehicle power supply system shown in FIG. 1.

[Calculation of Internal Resistance (0)]

Figure 4:
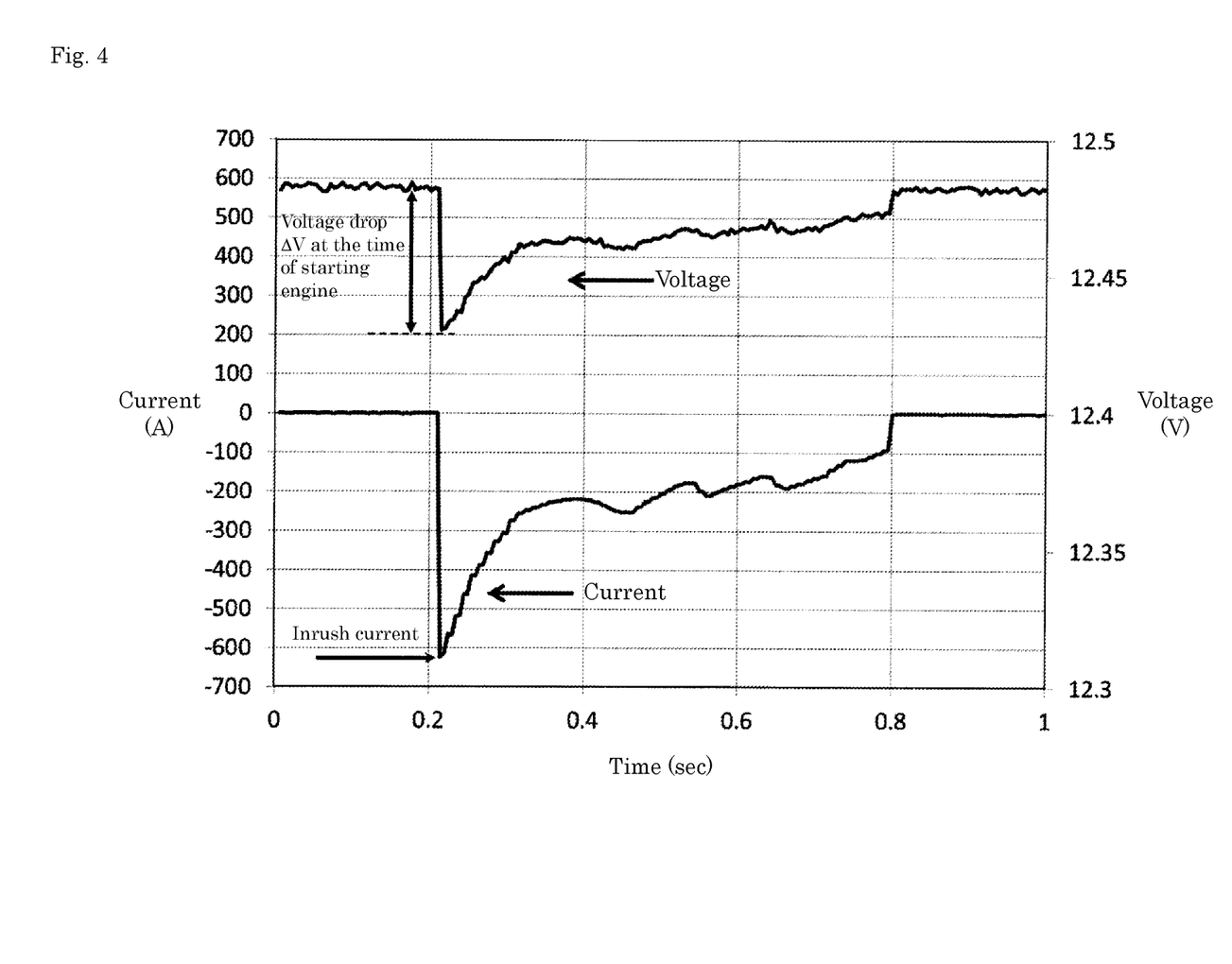
FIG. 4 is a view showing a change in voltage and current of the sub battery 2 at the time of starting an engine.

At the time of starting the engine of the vehicle (at the time of supplying power to the STA6 of the sub battery 2), the first calculating unit 12 obtains data on a voltage value and a current value of the battery 2 measured by the voltage sensor 10 and the current sensor 11 (data shown in FIG. 4, for example). The first calculating unit 12 obtains a voltage drop amount ΔV and an inrush current I of the sub battery 2 at the time of starting the engine of the vehicle based on the above-mentioned data (S20).

The first calculating unit 12 calculates a first internal resistance (internal resistance (0)) by a following formula (1) using the obtained voltage drop amount ΔV and inrush current I of the sub battery 2 (S21). The internal resistance (0) expresses a value of the first internal resistance calculated by the first calculating unit 12.

internal resistance (0) (mΩ)=voltage drop amount ΔV (V)/inrush current I (A)×1000   (1)

The internal resistance (0) can be considered as a sum of a reaction resistance (0) and a parts resistance (0).

[Calculation of Reaction Resistance (0)]

The second calculating unit 13 forcibly discharges the sub battery 2 by controlling a voltage applied to the sub battery 2 by operating the voltage adjuster 3 during traveling of the vehicle immediately after calculation of an internal resistance (0), and measures a voltage and a current of the sub battery 2 at that point of time (S22).

To be more specific, at the time of discharging the sub battery 2, the second calculating unit 13 obtains data on a voltage value and a current value of the sub battery 2 outputted from the voltage sensor 10 and the current sensor 11 (S22). Usually, an output voltage of the voltage adjuster 3 is adjusted higher than a voltage of the sub battery, and power is supplied to the load from the main battery. When an output voltage of the voltage adjuster 3 is temporarily dropped from a normal state by the voltage controller 13*a*, an output current of the voltage adjuster 3 is gradually decreased, and an output current of the sub battery is gradually increased so that the sub battery is forcedly discharged. Thereafter, when the output voltage of the voltage adjuster 3 is increased to an initial voltage, forced discharging is finished. At this stage of operation, a load current is maintained approximately at a 25A. With such an operation, data shown in FIG. 5 can be obtained. In the example shown in the drawing, an output voltage of the voltage adjuster 3 is temporarily dropped from 15V to 11V and, thereafter, is increased to an initial voltage, that is, 15V.

The second calculating unit 13 calculates a second internal resistance (reaction resistance (0)) of the sub battery 2 based on a relationship between a voltage and a current of the sub battery 2 using data obtained in the above-mentioned operation (S23). The reaction resistance (0) indicates a reaction resistance obtained by first calculation of a second internal resistance after the internal resistance (0) is calculated. Thereafter, calculation of the second internal resistance is performed n times (n being an integer or one or more). Then, a second internal resistance obtained by n-th calculation is assumed as a reaction resistance (n).

In this embodiment, the second calculating unit 13 calculates a reaction resistance (0) as a second internal resistance immediately after a first internal resistance is calculated and hence, a reaction resistance of the sub battery 2 is minimally changed between the calculation of the first internal resistance and the calculation of the second internal resistance. Accordingly, the reaction resistance (0) can be considered as the reaction resistance (0) included in the internal resistance (0) (S23).

Specifically, the second internal resistance is calculated by a following method.

The second calculating unit 13 calculates a range where a current value is monotonously decreased or increased using data obtained by the above-mentioned operation. At this stage of operation, for example, it is desirable to obtain a monotonously decreasing range or a monotonously increasing range of one or more seconds with a change rate of 10 A/sec to 15 A/sec. Next, the second calculating unit 13 linearly approximates data on a voltage value and a current value within the range by a least square method thus acquiring an approximate straight line L, and calculates an inclination of the approximate straight line L. Further, the second calculating unit 13 calculates a reaction resistance (0) by a following formula (2) using the calculated inclination value.

reaction resistance (0) (mΩ)=inclination of approximate curve $L$×1000   (2)

Figure 5:
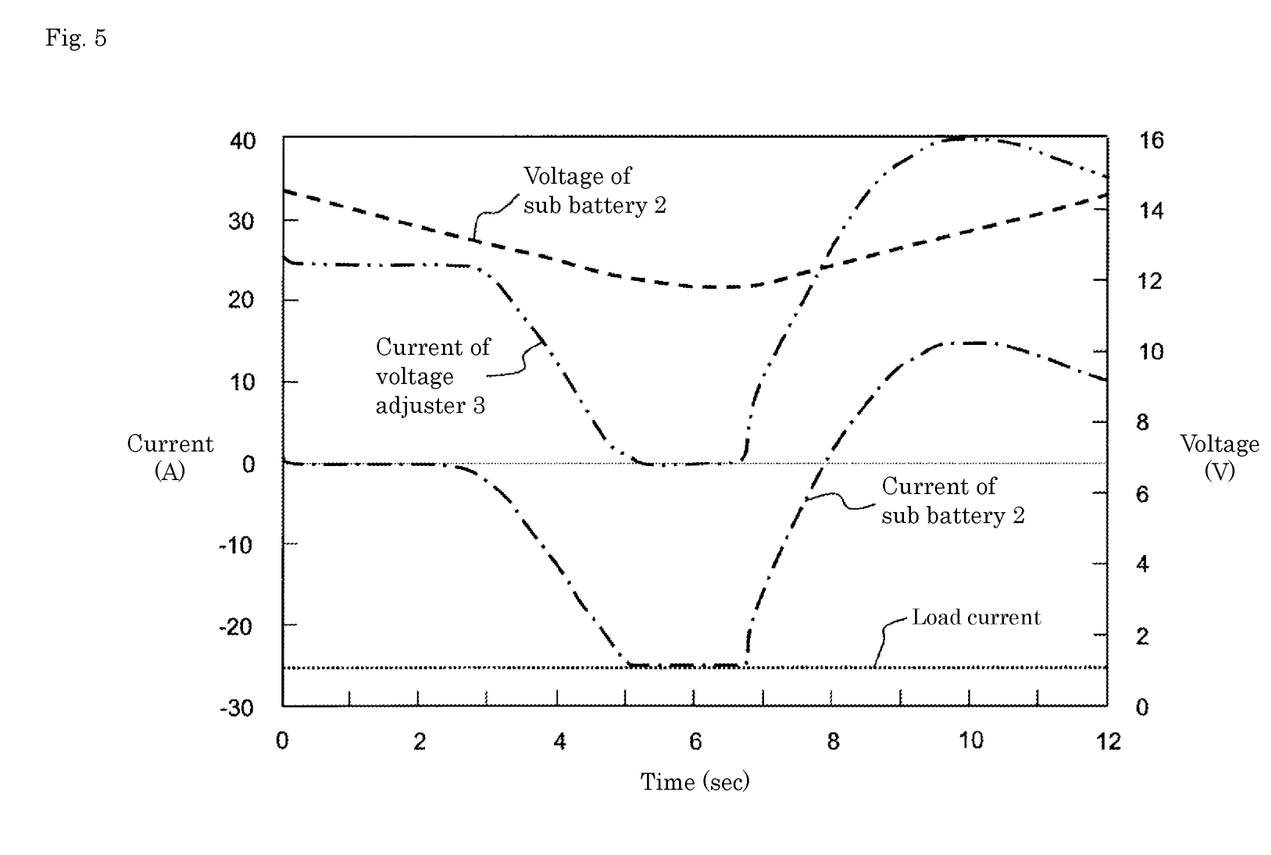
FIG. 5 is a view showing a change in voltage and current of the sub battery 2 when forcedly discharging the sub battery 2 by operating a voltage adjuster 3 during traveling of a vehicle.
Figure 6:
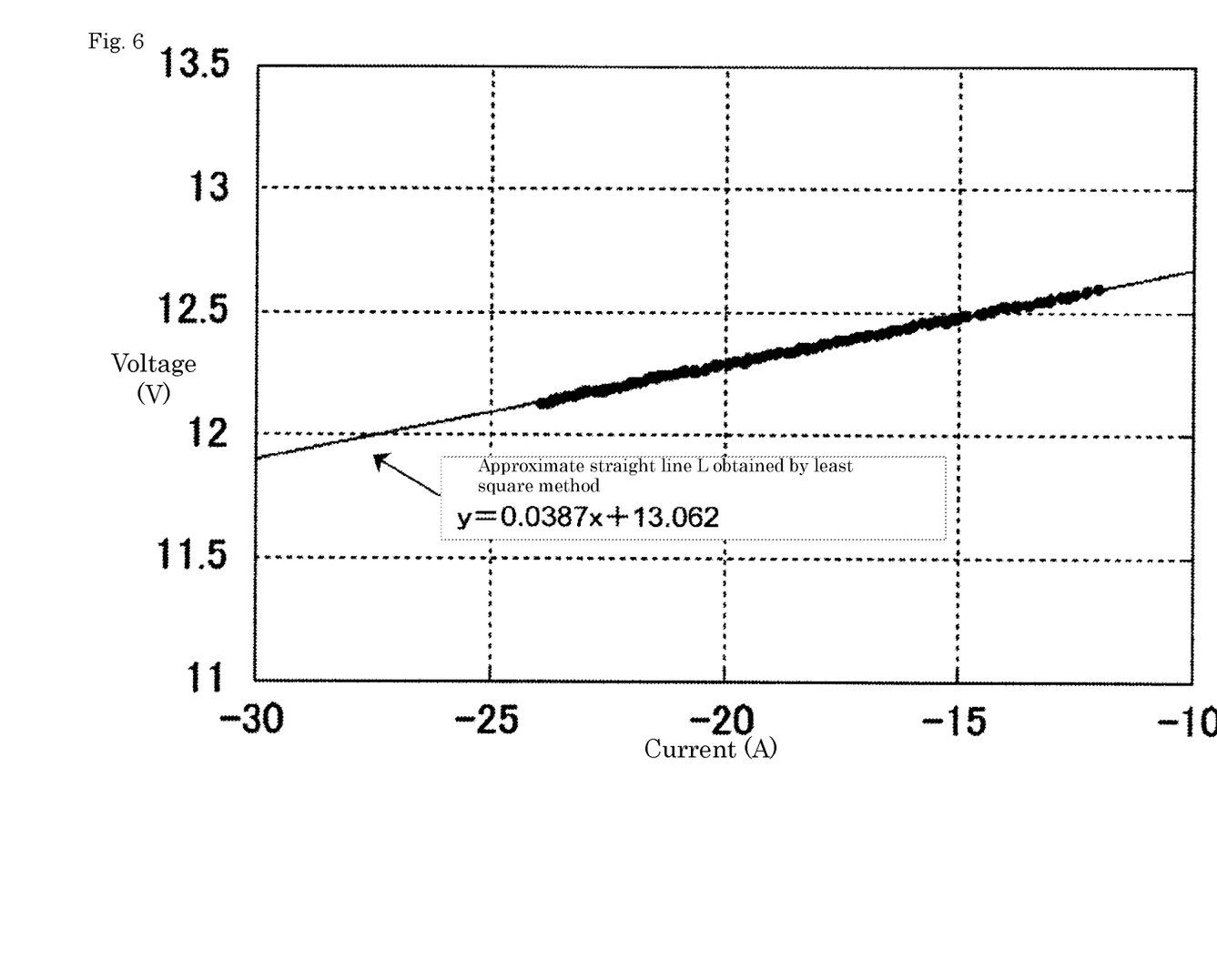
FIG. 6 is a view showing an approximate straight line L obtained by linearly approximating data on a voltage and a current shown in FIG. 5 by a least square method.

For example, a range where a current value is monotonously decreased (−24 A to −12 A in FIG. 5) is calculated based on data shown in FIG. 5. Data on a voltage value (V) and a current value (A) within the range is approximated by a least square method so that an approximate straight line L shown in FIG. 6 can be obtained, and an inclination of the approximate straight line L (0.0387×1000 (mΩ)) is set as a reaction resistance (0).

[Calculation of Parts Resistance (0)]

The state determining unit 14 calculates a parts resistance (0) included in the internal resistance (0) based on the internal resistance (0) and the reaction resistance (0) which are obtained by the above-mentioned operation (S24). To be more specific, a parts resistance (0) is calculated by a following formula (3).

$$\text{parts resistance (0)} = \text{internal resistance (0)} - \text{reaction resistance (0)} \quad (3)$$

A second internal resistance is calculated immediately after the calculation of a first internal resistance and hence, it is assumed that a parts resistance of the sub battery 2 is minimally changed between the calculation of the first internal resistance and the calculation of the second internal resistance.

[Calculation of Reaction Resistance (n)]

Further, the second calculating unit 13 obtains a reaction resistance (n) periodically or when necessary also during the subsequent traveling of the vehicle by a technique substantially equal to the technique used in the case of the calculation of the reaction resistance (0) (S25, S26). The reaction resistance (n) indicates a reaction resistance obtained by n-th calculation of a second internal resistance except for the calculation immediately after the calculation of the first internal resistance.

[Calculation of Parts Resistance (n)]

The state determining unit 14 calculates a parts resistance (n) of the sub battery 2 at a point of time that a second internal resistance is calculated n-th times based on the reaction resistance (n), the reaction resistance (0), and the parts resistance (0) obtained by the above-mentioned operation (S27). To be more specific, the parts resistance (n) is calculated by a following formula (4).

$$\text{parts resistance }(n) = \alpha \times \text{parts resistance }(0) \times (\text{reaction resistance }(n)/\text{reaction resistance }(0)) \quad (4)$$

In the formula (4), symbol $\alpha$ is a coefficient decided based on the degradation of the sub battery 2 brought about by a normal use (normal degradation of members contributing to a parts resistance of the sub battery) and a failure mode (for example, a degree of connection failure, short-circuiting, and breaking of members), and is preliminarily obtained by actual measurement or the like. For example, in the case of degradation brought about by a normal use of the sub battery 2, a in the above-mentioned formula (4) may be set to 1. That is, in such a case, it is considered that an increase rate of a parts resistance, that is, parts resistance (n)/parts resistance (0) is equal to an increase rate of a reaction resistance, that is, reaction resistance (n)/reaction resistance (0).

[Calculation of Internal Resistance (n)]

The state determining unit 14 calculates an internal resistance (n) which is a sum of a reaction resistance and a parts resistance of the sub battery 2 at a point of time that the calculation of a second internal resistance is performed n-th times based on the reaction resistance (n) and the parts resistance (n) obtained by the above-mentioned operation (S28). To be more specific, the internal resistance (n) is calculated by a following formula (5).

$$\text{internal resistance }(n) = \text{parts resistance }(n) + \text{reaction resistance }(n) \quad (5)$$

[Determination of Battery State]

The state determining unit 14 determines a state of the sub battery 2 during traveling of the vehicle based on the transition of the first internal resistance and the second internal resistance, that is, based on the value of the internal resistance (0) and the value of the internal resistance (n) obtained by the above-mentioned operation.

To be more specific, when the value of internal resistance (n)/internal resistance (0) is equal to or more than a predetermined value (for example, 2 or more when symbol $\alpha$ in the formula (4) is 1), the state determining unit 14 determines that the degradation of the sub battery 2 in a normal use has progressed to an extent that the sub battery 2 cannot be continuously used (S29, S30).

When a value of internal resistance (n)/internal resistance (0) is less than a predetermined value (for example, less than 2 when symbol $\alpha$ in the formula (4) is 1), the state determining unit 14 determines that there is no failure in the sub battery 2 so that the sub battery 2 can be continuously used, and continuously performs the detection of a state of the sub battery 2.

Figure 7:
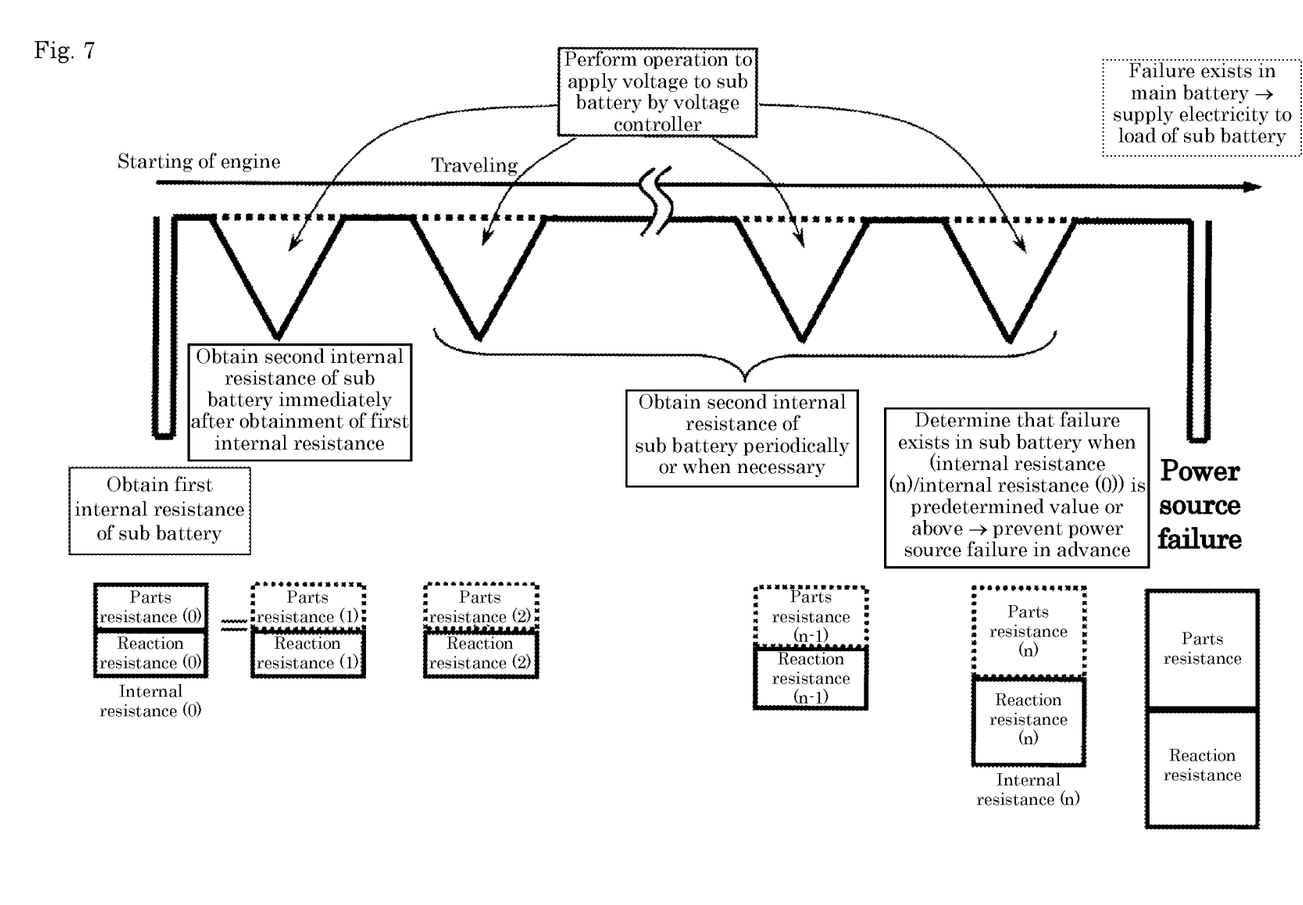
FIG. 7 is a schematic view showing a scheme of the detection of a state due to obtainment of an internal resistance of the sub battery 2 during traveling of the vehicle from the starting of the engine.

As shown in FIG. 1, since the on-vehicle power supply system includes the state detector 4. Accordingly, as shown in FIG. 7, it is possible to accurately detect a state of the sub battery 2 also during normal traveling of a vehicle. As a result, it is possible to prevent in advance the occurrence of a failure of the sub battery 2 which may be caused due to the degradation of the sub battery 2 during normal traveling of a vehicle.

In the above-mentioned embodiment, the description has been made by exemplifying the case where a nickel-metal hydride rechargeable battery is used as the main battery 1. However, other power sources such as a lithium ion secondary battery, an electric double layered capacitor (EDLC), a fuel battery can be used.

In the above-mentioned embodiment, the description has been made by exemplifying the case where a lead-acid battery is used as the sub battery 2. However, other power sources such as a lithium ion secondary battery may be used.

In the above-mentioned embodiment, the description has been made with respect to the case where the on-vehicle power source system uses two power sources consisting of a 42V-system power source and a 14V-system power source. However, provided that the on-vehicle power source system can be established as a system, a power source may be further added to the above-mentioned on-vehicle power source system. Further, provided that the on-vehicle power source system can be established as a system, a voltage of the power source may be suitably changed.

In the above-mentioned embodiment, the on-vehicle power supply system includes both the MG8 and the ALT5. However, the on-vehicle power source system can be established as a system provided that the on-vehicle power supply system includes at least one of the MG8 and the ALT5.

In the above-mentioned embodiment, although the on-vehicle power supply system includes both the MG8 and the STA6, the on-vehicle power source system can be established as a system provided that the on-vehicle power supply system includes at least one of the MG8 or the STA6.

The on-vehicle power supply system of the present invention is preferably applicable to the detection of a state of a sub battery in an on-vehicle power supply system which includes: a main battery; a sub battery which is connected in parallel with the main battery; and a voltage adjuster which controls a voltage of power supplied from the main battery and the sub battery.

Although the present invention has been described with respect to the preferred embodiment at a present point of time, the disclosure should not be construed as limitative. Various changes and modifications will become clearly apparent to those skilled in the art to which the present invention pertains upon reading the above disclosure.

Accordingly, it should be construed that the present invention includes all changes and modifications without departing from the true spirit and scope of the present invention.

DESCRIPTION OF REFERENCE SIGNS

1: main battery
2: sub battery
3: voltage adjuster
4: state detector
5: ALT
6: STA
7: accessory load
8: MG
9: actuator
10: voltage sensor
11: current sensor
12: first calculating unit
13: second calculating unit
13a: voltage controller
14: state determining unit

The invention claimed is:

1. An on-vehicle power supply system, comprising:
a main battery,
a sub battery connected in parallel with the main battery,
a voltage adjuster which controls a voltage of power supplied from the main battery and the sub battery, and
a state detector which detects a state of the sub battery, wherein:
the state detector comprises:
a first calculating unit which obtains a first internal resistance that contains a reaction resistance and a parts resistance of the sub battery,
a second calculating unit which obtains a second internal resistance that contains a reaction resistance of the sub battery, and
a state determining unit which determines a state of the sub battery,
the first calculating unit calculates the first internal resistance based on a voltage drop amount and an inrush current of the sub battery when supplying power to a load,
the second calculating unit calculates the second internal resistance based on a relation between a voltage and a current of the sub battery when forcedly discharging the sub battery by controlling the voltage adjuster immediately after calculating the first internal resistance and thereafter once or more, and
the state determining unit determines the state of the sub battery based on the first internal resistance and a transition of the second internal resistance.

2. The on-vehicle power supply system according to claim 1, wherein the second calculating unit comprises a voltage controller which controls the voltage adjuster.

3. The on-vehicle power supply system according to claim 1, wherein:
the voltage adjuster comprises a DC/DC converter connected to the main battery, and the DC/DC converter is connected in parallel with the sub battery.

4. The on-vehicle power supply system according to claim 1, wherein:
immediately after the first calculating unit calculates the internal resistance (0) as the first internal resistance, the second calculating unit calculates, as the second internal resistance, the reaction resistance (0) contained in the internal resistance (0), and
the state determining unit calculates the parts resistance (0) contained in the internal resistance (0) based on the reaction resistance (0).

5. The on-vehicle power supply system according to claim 4, wherein:
the state determining unit calculates the parts resistance (n) at a calculation-time-point of the n-th second internal resistance of the sub battery based on the reaction resistance (0), the parts resistance (0), and the reaction resistance (n) calculated by the second calculating unit as the n-th second internal resistance, and
the state determining unit calculates a sum of the reaction resistance (n) and the parts resistance (n) as the internal resistance (n).

6. The on-vehicle power supply system according to claim 5, wherein the state determining unit determines that the sub battery has failed when the internal resistance (n) divided by the internal resistance (0) is a predetermined value or more.

7. A state detecting method for a sub battery in an on-vehicle power supply system that includes a main battery, the sub battery connected in parallel with the main battery, a voltage adjuster which controls a voltage of power supplied from the main battery and the sub battery, the method comprising:
a first step to calculate a first internal resistance, which contains a reaction resistance and a parts resistance, based on a voltage drop amount and an inrush current of the sub battery when supplying power to a load,
a second step to calculate a second internal resistance, which contains a reaction resistance of the sub battery, based on a relation between a voltage and a current of the sub battery when forcedly discharging the sub battery by controlling the voltage adjuster immediately after calculating the first internal resistance and thereafter once or more, and
a third step to determine a state of the sub battery based on the first internal resistance and a transition of the second internal resistance.

8. The state detecting method according to claim 7, wherein:
the second step comprises a step to calculate, immediately after calculating the internal resistance (0) as the first internal resistance, the reaction resistance (0) contained in the internal resistance (0) as the second internal resistance, and
the third step comprises a step to calculate the parts resistance (0) contained in the internal resistance (0) based on the reaction resistance (0).

9. The state detecting method according to claim 8, wherein:
the second step comprises a step to obtain the reaction resistance (n) by calculating the n-th second internal resistance, and
the third step comprises steps to:
calculate the parts resistance (n) at a calculation-time-point of the n-th second internal resistance of the sub battery based on the reaction resistance (0), the parts resistance (0), and the reaction resistance (n), and
calculate a sum of the reaction resistance (n) and the parts resistance (n) as the internal resistance (n).

10. The state detecting method according to claim 9, wherein the third step comprises a step to determine that the sub battery has failed when the internal resistance (n) divided by the internal resistance (0) is a predetermined value or more.

* * * * *